United States Patent
Youssef

(10) Patent No.: US 10,466,081 B2
(45) Date of Patent: Nov. 5, 2019

(54) ITERATIVE METHOD OF DETERMINING A BIAS OF A SENSOR FOR MEASURING A SUBSTANTIALLY CONTINUOUS PHYSICAL VECTOR FIELD

(71) Applicant: MOVEA, Grenoble (FR)

(72) Inventor: Joe Youssef, Grenoble (FR)

(73) Assignee: Movea SAS, Grenoble (FR)

( * ) Notice: Subject to any disclaimer, the term of this patent is extended or adjusted under 35 U.S.C. 154(b) by 748 days.

(21) Appl. No.: 14/652,658

(22) PCT Filed: Dec. 10, 2013

(86) PCT No.: PCT/EP2013/076024
§ 371 (c)(1),
(2) Date: Jun. 16, 2015

(87) PCT Pub. No.: WO2014/095476
PCT Pub. Date: Jun. 26, 2014

(65) Prior Publication Data
US 2015/0346003 A1 Dec. 3, 2015

(30) Foreign Application Priority Data
Dec. 18, 2012 (FR) .................................. 12 62211

(51) Int. Cl.
*G01D 18/00* (2006.01)
*G01R 35/00* (2006.01)
(Continued)

(52) U.S. Cl.
CPC ............. *G01D 18/00* (2013.01); *G01C 17/38* (2013.01); *G01P 21/00* (2013.01); *G01R 33/0017* (2013.01); *G01R 35/00* (2013.01)

(58) Field of Classification Search
CPC ......... G01D 18/00; G01C 17/38; G01P 21/00; G01R 33/0017; G01R 35/00
See application file for complete search history.

(56) References Cited

U.S. PATENT DOCUMENTS

| | | | |
|---|---|---|---|
| 7,587,277 B1 * | 9/2009 | Wells ................ | G01C 21/165 701/510 |
| 8,275,544 B1 | 9/2012 | Wells | |
| 2011/0178707 A1 * | 7/2011 | Sachs ................ | G01C 17/38 701/472 |

FOREIGN PATENT DOCUMENTS

| | | | |
|---|---|---|---|
| EP | 2028504 | * | 8/2007 |
| EP | 2 028 504 | | 2/2009 |

OTHER PUBLICATIONS

Sabatini A.M., "Quaternion-based extended Kalman filter for determination orientation by inertial and magnetic sensing", IEEE Transactions on Biomedical Engineering, (2006), vol. 53, No. 7.*
(Continued)

*Primary Examiner* — Mohamed Charioui
*Assistant Examiner* — Catherine T. Rastovski
(74) *Attorney, Agent, or Firm* — BakerHostetler

(57) ABSTRACT

An iterative method determines a bias of a sensor for measuring a substantially continuous physical vector field in a reference frame, in which the sensor is linked in movement to a frame that is mobile in the reference frame. An iteration of the method includes:
  estimating a bias value in the mobile frame,
  correcting a measurement from the sensor of the estimated bias value, in the mobile frame,
  transforming the corrected measurement of the mobile frame in the reference frame, from a rotational change of frame operator between the mobile frame and the reference frame, and
  forming a criterion representative of a variation of the transformed corrected measurement.

16 Claims, 4 Drawing Sheets

(51) Int. Cl.
  *G01P 21/00* (2006.01)
  *G01C 17/38* (2006.01)
  *G01R 33/00* (2006.01)

(56) References Cited

OTHER PUBLICATIONS

International Search Report and Written Opinion from PCT/EP2013/0576024, dated Apr. 7, 2014.

Taubin, "Estimation of Planar Curves, Surfaces,and Nonplanar Space Curves Defined by Implicit Equations with Applications to Edge and Range Image Segmentation" IEEE Transactions on Pattern Analysis and Machine Intelligence, vol. 13, No. 11, Nov. 1991, pp. 1115-1138.

Pratt, "Direct Least-Squares Fitting of Algebraic Surfaces" Computer Graphics, vol. 21, No. 4, Jul. 1987, pp. 145-152.

Kasa "A Circle Fitting Procedure and Its Error Analysis" IEEE Transactions on Instrumentation and Measurement, Mar. 1976, pp. 8-14.

\* cited by examiner

ITERATIVE METHOD OF DETERMINING A BIAS OF A SENSOR FOR MEASURING A SUBSTANTIALLY CONTINUOUS PHYSICAL VECTOR FIELD

FIELD OF THE INVENTION

Various embodiments of the invention relate to a method for determining a bias of a sensor for measuring a substantially continuous physical vector field, or, in other words, to a continuous calibration method for such a sensor, and to an associated device.

BACKGROUND OF THE INVENTION

Many devices, such as cellphones, joysticks, remote controls with motion sensors, devices with sensors for measuring human movement intended for sporting or medical applications, or receivers for satellite navigation systems, use embedded sensors, such as magnetometers, accelerometers, or directional antennas (for measurements of directions of arrival or DOA). These sensors supply a measurement of a physical vector field that is generally substantially uniform in time and in space added to a bias or "offset". By definition, the bias is the value read by the sensor in a zero field, i.e. when the physical field is zero. The use of the measured signal by the physical field sensor entails a conversion of the raw data into physical units by the application of a bias correction and sensor sensitivity parameters.

This bias can change abruptly or slowly over time. It does not depend on the physical field present in the environment (or ambient field), but on the sensor itself and/or on effects of the supporting device secured to the sensor. All of these effects, due to the sensor itself or to the device bearing the sensor are called endogenous (meaning endogenous to the device bearing the sensor), unlike the ambient field, called exogenous which is the object that is to be measured. To give an example of endogenous effect, the conditioning and conversion electronics of the sensor, the constituent mechanical or electronic elements of the device bearing the sensor, can be the source of the bias component. Some sensors also intrinsically exhibit a bias, which can be sensitive and variable as a function of temperature and/or of time. It can also be noted that the very step of manufacturing of the electronic board necessary for the device bearing the sensor, with its method for soldering the sensor onto the board, can modify the bias parameters of the sensor, for example by the application of mechanical stresses from the soldering step.

BRIEF SUMMARY

One aim of an embodiment of the invention is to propose a bias estimator that is automatic, without involving conscious involvement on the part of the user of the electronic device bearing the sensor.

Symbolically, the magnetometer measures the ambient magnetic field as an external physical field, but is also sensitive to any magnetization of the ferrous materials in its closer vicinity, to the magnetic effect of the electric currents flowing nearby, in particular those which form the device bearing the sensor. These materials or electrical circuits are secured to the frame of the sensor. Because this magnetization or these magnetic effects induced by electric currents are fixed in the frame of the sensor, their contribution acts as an additional vector constant to the ambient field, thus forming an additional constant on each measurement axis of the sensor. It is typically these magnetic effects due to the device in which the magnetometer is embedded that apparatuses of telephone or tablet type, or more generally all devices in which a magnetometer is embedded, can experience during their use. These effects contribute to biasing the measurement of the ambient field.

In order to have a usable measurement of the physical vector field that is to be measured, it is desirable to subtract these measurement biases from the measurements transmitted by the sensor.

As a variant, the sensor can be an accelerometer which measures the ambient gravitational field as external physical field. For the accelerometer, given the nature of the measurement, there is generally no fear of bias sources originating from the device itself. Thus, only the offset due to the sensor itself has to be considered. However, as for the magnetometer, this offset can be considered as unknown and change over time, such as under the effect of temperature for example. Note that for this sensor, the step of soldering on the electronic board can considerably modify the offset value. It is essential to know this offset to be able to use the acceleration measurement. A continuous identification of this offset can thus constitute an advantage which makes it possible to provide a bias-free measurement throughout the use of the sensor.

Some bias elimination methods require the performance of a particular gesture (as is recommended in certain mobile platforms, the user being prompted to perform a gesture similar to a figure "8" in space, or rotations of the device, or fixed positions relative to the terrestrial frame, for example). Such methods are relatively constraining for the user, or sometimes impossible to apply for devices embedded on board motor vehicles. These methods require the active cooperation of the user and interrupt his or her use of the device, since the latter has to perform particular gestures. Moreover, if the bias changes, the latest value thus estimated with the user cooperation method can prove obsolete. If the calibration system is adapted to detect this obsolescence, it must then once again call on the user to update the bias and thus once again interrupt his or her use.

To overcome these constraints, it therefore appears desirable to provide so-called continuous calibration methods, which do not require any conscious and active cooperation on the part of the user, and act themselves to estimate and thus allow for the bias correction, in the background.

Methods are also known that make it possible to identify these measurement biases by adjusting a sphere over a set of measurement points of the sensor, the bias of measurements being the center of the sphere.

The document "A curve fitting procedure and its error analysis" by I. Kasa, IEEE Trans, Inst Meas, 25:8-14, 1976, proposes a method of approximating a sphere model on a cloud of points. In effect, in the model commonly used, the ambient physical field has a norm that is constant over a limited volume. The rotational movements of the device bearing the sensor must therefore lead to a set of measurements distributed over a sphere, the center of the sphere being representative of the bias of the sensor. The identification of the best sphere passing through the points of the measurement set and notably the position of its center then makes it possible to provide an estimation of the offset. The method is described for a purely general and geometrical purpose. It is fairly economical in computation terms, but operates only if the points used are correctly distributed over a sphere.

The offset estimation methods designed on this principle therefore aim for the norm of the vectors formed on the measurements from the sensor and calibrated (therefore corrected of the offset) to be equal to the norm of the ambient field at the position of the sensor. For a constant ambient field, the norm of the duly formed vectors should be constant if the bias is correct. If the bias is not correct, these norms will not be constant. It can thus be seen that the estimated offset deriving from these methods aims to make the norm of the vectors formed constant. The criterion is global on the norm of the vector, and cannot take into account the three components of the vector. Now, the effect of a norm operation amplifies the influence of the "great" components compared to the "small" components. The minimization of the deviations from the norm cannot therefore guarantee best quality of calibration of the offsets on each of the components. It therefore appears advantageous to propose methods for which it is possible to form criteria on the components and not only on a global norm.

Moreover, if this method is applied to the calibration problem, it does not work for a partial calibration.

A partial calibration corresponds to the calibration of only a subset of measurement axes of a sensor with multiple measurement axes.

The documents "Estimation of planar curves, surfaces and non-planar space curves defined by implicit equations, with applications to edge and range image segmentation" by G. Taubin, IEEE Trans Pattern Analysis Machine Intelligence, 13:1115-1138, 1991, and "Direct least-squares fitting of algebraic surfaces", by V. Pratt, Computer Graphics, 21:145-152, 1987, propose a method operating with data that is irregularly distributed (for example on a crown), but involving a singular value decomposition, or SVD, or a Newton descent, which is not economical in computation terms, and does not work in partial calibration. Such a method is therefore difficult to implement on a device having a computation capacity limited by the processor or by the energy autonomy required.

Note that these methods rely exclusively on the measurements from the sensor whose bias has to be estimated. Now, many devices have other sensors embedded which supply information on the attitude of the device. Such information is available and it is one of the aims of the invention to use the information, in order to make the estimation of the bias of the sensor more rapid and robust. Thus, if it is determined that the device does not move using an auxiliary sensor, while it is observed that the sensor for which the bias has to be determined supplies measurements that are variable in time, the immobility information can thus be exploited to participate in the computation of the bias.

Continuous methods have moreover been proposed which rely exclusively on the field measured by the sensor itself. These methods offer good properties of being continuous, not requiring any specific action from the user. However, they can be made defective in certain circumstances, notably when the physical field varies in space over small spatial scales, or, in dual version, when a field source is displaced in proximity to the sensor. It is then possible for these methods to be made defective because it is then difficult to identify that the source of the duly observed anomaly (anomaly relative to the model of a uniform physical field) is not due solely to a change in the bias of the measurement. These methods therefore present a risk of non-robustness in this particular type of situation. Finally, note that, in principle, these methods are "blind" because they do not use information other than that from the sensor for which the bias is to be eliminated, the other information from other sensors present not being taken into account.

SUMMARY OF THE INVENTION

One aim of the invention is to resolve the abovementioned problems.

One aim of the invention is to determine whether the bias has to be re-updated, by limited computations, in the background, on any movements.

One aim of the invention is to determine these measurement biases by limited computations, in the background, on any movements.

One aim of the invention is to exploit measurements from the other sensors embedded in the device, in order to improve the accuracy and the robustness of the bias.

One aim of the invention is to be able to operate in partial calibration mode.

Thus, there is proposed, according to one aspect of the invention, an iterative method for determining a bias of a sensor for measuring a substantially continuous physical vector field in a reference frame, said sensor being linked in movement to a frame, that is mobile in the reference frame, an iteration of the method comprising the following steps consisting in:

iteratively estimating a bias value in the mobile frame, correcting the measurement from the sensor of said estimated bias value, in the mobile frame, transforming said corrected measurement of the mobile frame in the reference frame, from a rotational change of frame operator between the mobile frame and the reference frame, and forming a criterion representative of a variation of said transformed corrected measurement.

Such a method makes it possible to form a criterion that is simple and representative of the quality of the estimated bias, using the datum from a rotational change of frame operator between the mobile frame and the frame of reference. In effect, when the variation of said transformed corrected measurement is small compared to the noise from the measurement chain, then the bias is correctly estimated, whereas, when this variation is great, then the bias is not correctly estimated.

Estimating the value of the bias iteratively by application of an iterative method to a set of measurements makes it possible to continuously improve the bias value for each new available measurement, by iteratively optimizing the criterion representative of the quality of the bias. Moreover, this method makes it possible to confront situations in which the bias values of the sensor change over time, by taking into account new measurements.

In one embodiment, the method further comprises, in each iteration, a step consisting in minimizing said criterion as a function of said estimated bias value, in the mobile frame, to determine the value of the bias, by comparing the value of the bias to the estimated bias value minimizing the criterion.

It is thus possible to determine a bias of a sensor for measuring a substantially continuous physical vector field in a reference frame, without intervention of the user.

According to one implementation, said change of frame operator between the mobile frame and the reference frame is determined from measurements supplied by a gyrometer linked in movement to the mobile frame.

A gyrometer is often present in the platforms that use an accelerometer and/or a magnetometer, because it is a sensor which delivers information of a nature complementing these other two sensors also, this information is generally already available. Thus, most cellphones, tablets, remote controls with motion measurement, joysticks, devices for analyzing movement for health or for analyzing sporting gestures, are equipped with gyrometers, accelerometers and magnetometers.

It can moreover also be noted that, for a significant proportion of the devices implementing such physical field sensors, it is now commonplace to embed, on board, a rotation speed sensor or gyrometer. The latter supplies information complementing that from the physical field sensors and it is therefore commonly included in these devices. For example, smartphones and touch tablets commonly embed, in addition to the pairing of accelerometer and magnetometer, which are two physical field sensors linked to the Earth, a gyrometer which measures the speeds of rotation of the device about its axes. This trio A, G, M, respectively for accelerometer, gyrometer and magnetometer, is thus commonly present in these mobile devices. For many functions, such as, for example, measuring the orientation of the device in the terrestrial frame, it is by combining the information measured by this trio of sensors that it is possible to provide a measurement of orientation that is accurate, robust and capable of delivering orientations in rapid movement mode. Thus, the attitude control units embedded on board cellphones now commonly consist of an accelerometer, a magnetometer and a gyrometer. Just as for the magnetometers and the accelerometers, the techniques of miniaturization make it possible to provide these gyrometric sensors in bulk, at lower cost and for reasonable electrical consumption. For a growing list of functions, the three accelerometer, magnetometer and gyrometer sensors are activated at the same time, because they all participate, through the nature and the quality of the information that they deliver, in the make-up of sophisticated functions, such as, for example, measurement of orientation.

It is thus possible, using the data from the gyrometer, and conventional methods implementing an integration of the signal that it delivers, to estimate the change of frame operator between the mobile frame and the reference frame. The integration operation entails, conventionally, knowing a value of the rotation operator at a given instant, because this operation supplies a value of the relative rotation operator between two instants. It should be noted that the proposed method stands up to not knowing a value of the change of frame operator at a given instant and it also remains robust to the drift of the duly estimated change of frame operator, the latter element being due to the drift of bias of the gyrometric sensor. The estimator of the orientation operator can be supplied to the method from data from the gyrometer, to within a constant rotation operation, which does not penalize the method proposed in the invention. Moreover, a slow drift of the rotation operator thus computed from the signal from a gyrometer is also compatible with the method described in the invention, inasmuch as the criterion is constructed over a finite window of samples, therefore with a past measurements omission factor.

In one implementation, said change of frame operator between the mobile frame and the reference frame is determined from measurements supplied by an attitude control unit, an optical sensor, an electromagnetic sensor or a mechanical sensor.

Thus, it is possible to use the duly supplied orientation datum in order to form a measurement from the physical field sensor corrected in the reference frame which thus isolates and quantifies the quality of the estimated bias of the physical field sensor.

According to one implementation, said criterion is formed by application, to said transformed corrected measurement, of a high-pass filtering operator, in order to extract an indicator of variation of said transformed corrected measurement relative to a continuous component.

For example, the high-pass filtering operator can be a derivative filter.

Thus, the variation of said transformed corrected measurement is isolated, its amplitude is representative of the effect due to the bias of the physical field sensor and it thus constitutes an indicator of the quality of the estimated bias.

In one implementation, said criterion implements a norm of the deviation between two values computed at two distinct instants, each of the values being computed by the application of the change of frame operator between the mobile frame and the reference frame, to the measurement from the sensor corrected of the bias value.

Thus, a scalar criterion is formed which is representative of the quality of the estimated bias, and is simple to compute, suitable for crude computers, for example embedded computers.

In one implementation, the determination of the estimated value of the bias by an iterative method uses a gradient descent.

Thus, via a method that is inexpensive in computation terms, the criterion is continually minimized and supplies estimated bias values which converge toward the bias value of the sensor.

According to one implementation, said determination of the bias of the measurement sensor is continuous.

Thus, it is possible to cope with situations in which the bias of the sensor changes as a function of time and the method continually delivers a better estimate of the bias and a quality indicator.

In one implementation, the method further comprises, in each iteration, a step of validation of effective updating of a candidate bias value, said validation being determined from an analysis of at least two values of said criterion, corresponding to the value of the validated preceding bias value and to said update candidate bias value.

Thus, an update with a manifestly incorrect value is avoided.

According to one implementation, said analysis comprises a verification that the value of the criterion corresponding to the candidate bias value is less than or equal to a function applied to the value of the criterion reached for the validated preceding bias value.

For example, said function can be identity.

Thus, it is certain that the new candidate bias value is better than the validated preceding bias value.

In one implementation, said function depends also on the time elapsed since the validated preceding bias value.

Thus, it is possible to take account of the fact that the old validated bias value becomes obsolete over time and to validate a new candidate bias value, even though it may not exhibit a criterion value less than the value of the criterion computed with the old validated bias value.

In one implementation, the method further comprises a step of validation of effective updating of a candidate bias value, said validation being determined from an analysis of the stability of the candidate bias.

This stability analysis can be determined from the temporal variation of the candidate bias.

Thus, it is certain that the new candidate bias value corresponds to a stabilized value thus indicating a stable and healthy sensor bias situation. This stability analysis thus participates in reinforcing the validation of the candidate bias and that the latter is better than the preceding validated bias value.

For example, said rotational change of frame operator between the mobile frame and the reference frame comprises a rotation matrix between the mobile frame and the reference frame.

Thus, a known computation method is proposed to apply the rotational change of frame operator, by the application of a matrix computation.

Furthermore, in the case of a rotation matrix, the inverse is equal to the transpose, which simplifies the computations.

Said sensor can be a magnetometer or an accelerometer.

Thus, the proposed method makes it possible to continually estimate the bias of a magnetometer or of an accelerometer.

According to another aspect of the invention, there is also proposed a system for iteratively determining a bias of a sensor for measuring a substantially continuous physical vector field in a reference frame, said sensor being linked in movement to a frame, that is mobile in the reference frame, the system comprising:

means for estimating a bias value in the mobile frame,
means for correcting the measurement from the sensor of said estimated bias value, in the mobile frame,
means for transforming said corrected measurement of the mobile frame in the reference frame, from a rotational change of frame operator between the mobile frame and the reference frame,
means for forming a criterion representative of a variation of said transformed corrected measurement, and
means for minimizing said criterion as a function of said estimated bias value, in the mobile frame, to determine the value of the bias, by comparing the value of the bias to the estimated bias value minimizing the criterion.

BRIEF DESCRIPTION OF THE DRAWINGS

The invention will be better understood on studying a few embodiments described as non-limiting examples and illustrated by the attached drawings in which.

DETAILED DESCRIPTION

Figure 1:
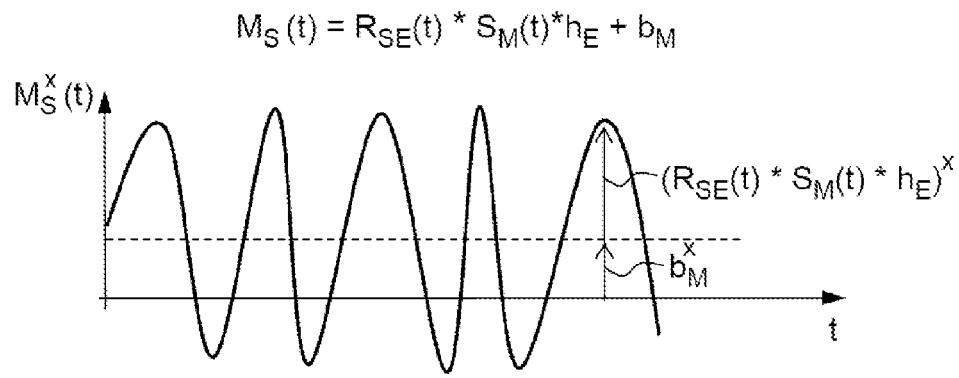
FIG. 1 schematically illustrates the temporal measurement supplied by an axis of the physical field sensor as a function of time, in the mobile frame, this measurement is made up of the constant bias value and of a variable part due to the movements of the mobile in the substantially constant field in the reference frame, according to one aspect of the invention.

In all the figures, the elements having the same references are similar.

An embodiment of a continuous calibration method utilizes the properties of the physical field measured. In its widest general form, this physical field presents as a vector field variable in space and in time in a reference frame. For the Earth's magnetic field or the Earth's gravitational field, this reference frame is fixed relative to the Earth. For the applications considered, given the time scales (from a few seconds to a few hours or days), the space dimensions considered (from a few centimeters to a few kilometers), and given the resolutions of the sensors employed (at best, a thousandth or ten thousandth of the terrestrial field for general consumer sensors), the physical field exhibits characteristics of stability in its spatial or temporal variations in a reference frame linked to the Earth. The temporal variations are generally negligible compared to the intensity of the main field (that is defined as the time- and space-constant component of the physical field for the time and space data of the scenario considered), and the spatial variations are generally of small amplitudes compared to the intensity of the main field.

Hereinafter in the description, the field generally considered is the magnetic field, and a magnetic sensor or magnetometer M, in a non-limiting manner, because the invention can, for example, also be applied to the gravitational field and an accelerometric sensor or accelerometer A.

For applications considered, the magnetic field formed on the surface of the Earth has the natural magnetic field originating from the Earth for its main contributor. It is spatially continuous and exhibits only very slow spatial and temporal variations on the scale of the planned scenarios.

In effect, on the scale of the dimensions of the Earth, and outside of essentially urban ambient contributors (buildings, vehicles, pipelines, furniture, etc), the spatial trend of the three components of the natural magnetic field is only a few nano-Tesla per kilometer for a typical normative value in France of 45 000 nT.

The temporal trend of the Earth's magnetic field is on a geological time scale. At most, a slow variation of the direction of the field can be observed over centuries. Moreover, the resolution of the sensors implemented, notably for the general consumer applications considered, means that the temporal magnetic signal deriving from the geomagnetic activity (of solar origin) which is added to the natural Earth's magnetic field can be neglected.

For smaller scales and in an environment that is more urban or typical of human activity, however, the spatial anomalies due to the environment can be much more ample. This environment contributes to adding, to the natural component of the terrestrial field, a second physical field component, still mostly constant in time, but exhibiting more rapid spatial variations than those of the Earth's magnetic field. The objects present in an environment generally correlating to human activity behave as so many small contributors to the ambient field which add their contributions to the Earth's natural field. A model generally employed models the intensity of their effect in amplitude as inversely proportional to the distance from the measurement point to the field-generating object, to the power of two or three. The effect can be significant for a measurement in immediate proximity to the object, but it decreases rapidly with distance and tends to fade away against the intensity of the Earth's field.

The magnetic field sensor-based devices are generally employed for the purposes of measuring orientation of the device relative to the terrestrial frame. Thus, it is the natural magnetic field of the Earth which represents the signal of interest. In the usual cases, the displacements are limited to the capacities of the carrier of the sensor. In the case of an attitude control unit on board a cellphone, a touch tablet, a remote control (for a game, for a motion-controlled media center), for example, the sensor assembly can be displaced very locally, within a range of a few meters. The more significant displacements, representative of mobility contexts, are of the order of a few hundred meters to a few kilometers. For indoor displacements, it should be noted that the mobile device is generally worn by its user, who stands away from the more significant magnetic sources (floors, walls, items of furniture, etc). For game scenarios, or navigation scenarios in 2D or 3D computer contents, the displacement takes place within a much more limited capture volume.

In scenarios of use, it is therefore possible to consider that the ambient magnetic field exhibits a component mostly due to the natural Earth's magnetic field, that can be considered constant in space and in time, with added contributions from the environment, which exhibit the same characteristics.

Embodiments of the invention provide a calibration method, which can be continuous, without the intervention of the user, for the bias affecting the measurement from a sensor of a physical field that is substantially constant in time and in space, by using, together with the raw signals from the sensor for which the bias is to be eliminated, a measurement of the rotation of the mobile device in which the physical field sensor is embedded.

The frame associated with the Earth is denoted "Earth" or E as reference frame. The frame associated with the mobile device, i.e. associated with the sensor, is denoted "Sensor" or S. The transformation operator which makes it possible to transform vectors from the frame E to the frame S in rotation is denoted $R_{SE}$. The different formalisms that are well known to those skilled in the art will be able to be used to implement this transformation operator (quaternions, rotation matrices, etc). This rotation varies over time, according to the movements of the mobile object, and is therefore denoted: $R_{SE}(t)$. If $v_E$ designates a vector expressed in the frame E and $v_S$ the same vector expressed in the frame S, the following relationship linking the three duly defined terms then applies:

$$v_S = R_{SE} * v_E.$$

This transformation is valid for any vector for which there is a desire to express the coordinates in the frame S from its expression in the frame E.

The Earth's natural field or Gauss field comprises all the effects of the deep-origin magnetic field sources.

The field of anomalies of the Earth's natural field comprises all the field sources not included in the Gauss field to form the ambient field, therefore, in particular, all the contributions of the sources near the surface of the Earth. It encompasses all the natural effects (magnetization of the rocks, magnetic effects of geological events) and non-natural effects (cars, buildings, etc).

The ambient field is the sum of the Earth's natural field and of the anomalies field. It is the one that can be observed.

The main field is, for a given scenario, and therefore a given space and time scale, the component of the ambient field which is essentially constant in space and in time.

The disturbance field is the component which is added to the main field to give the ambient field. The disturbance field is small compared to the main field.

$h_E(t)$ denotes the main physical field at the position of the magnetic sensor of the mobile device, in the frame of the Earth or reference frame E. By definition, the main field is substantially invariant in space and in time for the scales of the scenario considered. The consequence is that $h_E$ does not depend on time. $h_S(t)$ is its transform into the mobile frame S linked to the sensor. The following relationship linking the two duly defined vectors then applies: $h_S(t) = R_{SE}(t) * h_E$.

$M_S(t)$ denotes the signal delivered by the magnetic sensor M embedded in the mobile device, which measures the ambient magnetic field. A general model linking $M_S(t)$ to $h_E(t)$ can be written: $M_S(t) = R_{SE}(t) * S_M(t) * h_E(t) + p_S(t) + b_M(t)$.

$S_M(t)$ models the sensitivity (or gain) to switch from the units of the sensor to the physical units. This transformation can take into account any defects of alignment of the axes, of temperature, etc.

As indicated previously, $h_E(t)$ designates the main field at the position of the magnetic sensor, excluding magnetic disturbance field, and expressed in the frame E. $h_E(t)$ is therefore a vector quantity that is approximately constant in time, and the equation can be simplified by simply denoting $h_E$.

$p_S(t)$ represents the disturbances due to the field of magnetic disturbances measured on the axes of the sensor. In practice, these anomalies have a low amplitude relative to the main field. Finally, $b_M(t)$ models the bias measured at the sensor and therefore covers two origins: the bias of the sensor itself and the magnetic field created by the mobile object itself. $b_M(t)$ is generally likely to change over time, slowly and/or in jumps.

Embodiments of the invention provide a continuous estimator of the bias $b_M(t)$ from the raw signal $M_S(t)$ from the magnetic sensor or magnetometer M, and using a knowledge, however imperfect, of the rotational transformation operator between the reference frame of the Earth E and the mobile frame S linked to the magnetic sensor M. As for the methods set out in the prior art, the good properties of constancy of the main field are therefore fully exploited by these embodiments.

FIG. 1 shows a model representative of the typical signal $M_S^x(t)$ measured on one of the axes of the magnetic field sensor M, in this case the axis x. The models of the signals on other axes would behave similarly. The device in which the sensor is embedded is mobile in the reference frame, it is subject to rotations and/or translations in a volume of space defined by the scenario of use of the product. The amplitude units are given in the numerical unit of the sensor. A time-variable signal is observed, deriving from the application of the value of the main field $h_E$ assumed constant in time and in space instrumented by the reference frame, a rotational transformation operator, for example a rotation matrix, changing from the frame E to the frame S denoted $R_{SE}(t)$. This operator is variable in time, according to the rotational movements imparted on the mobile device.

The bias component is here represented by a constant over the observation time $b_M$. This bias component can be of any amplitude, it can be great relative to the amplitude of the temporal variations from the main field. It is unknown. According to the method of the invention, this bias component can also be variable in time, the proposed method being able to provide a continuous estimation of the bias over time.

Figure 2:
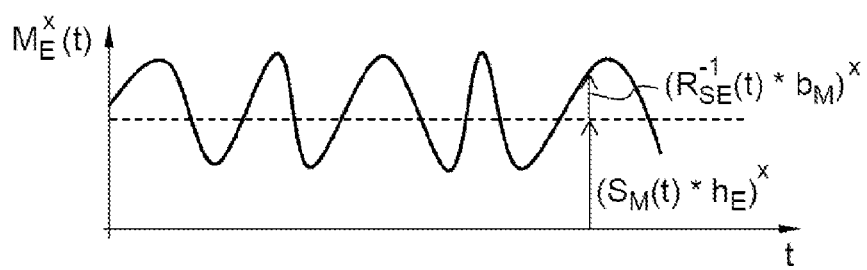
FIG. 2 schematically illustrates the method for transforming the measurement of the physical field sensor, from the mobile frame to the reference frame, and shows that the duly transformed measurement is this time made up of a substantially constant component due to the substantially constant physical field in the reference frame and of a time-variable component due to the bias of the physical field sensor, according to one aspect of the invention.

FIG. 2 shows a step of a method of an embodiment of the present invention. It includes transforming the vector signal $M_S(t)$ by the rotational change of frame operator, here denoted $R_{SE}^{-1}(t)$, between the mobile frame (S) and the reference frame (E) to obtain a vector signal $M_E(t)$ expressed in the reference frame E.

The duly transformed component of the main field $S_M(t)$ *$h_E$ is then a constant, the gain correction $S_M(t)$ being assumed constant in time, and the value of the main field being constant in the reference frame. The bias component is transformed by the same operation and then presents as a time-variable signal $R_S^{-1}(t)*b_M$, and one whose variations will be a function of the frequency of the movements of orientation of the mobile device. Thus, in this step, on this representation of the signals from the sensor transformed into the terrestrial frame E, it is identified that, when the bias component is correctly estimated and previously subtracted from the sensor signal, the signal obtained is then constant. The invention and its variants are based on this observation and propose a means of estimating the bias of the sensor.

The method of an embodiment of the invention thus emerges more clearly. It utilizes the principle that the bias sought is correctly estimated when the signal $M_E(t)$ obtained by transformation of $M_S(t)$ by the rotation operator $R_S^{-1}(t)$ no longer exhibits significant temporal variations, even though the object bearing the sensor is mobile. The embodiment of the invention is therefore based on the formation of a criterion whose amplitude is representative of the bias residue of the sensor, from measurements of the sensor transformed by the rotational change of frame operator.

Figure 3:
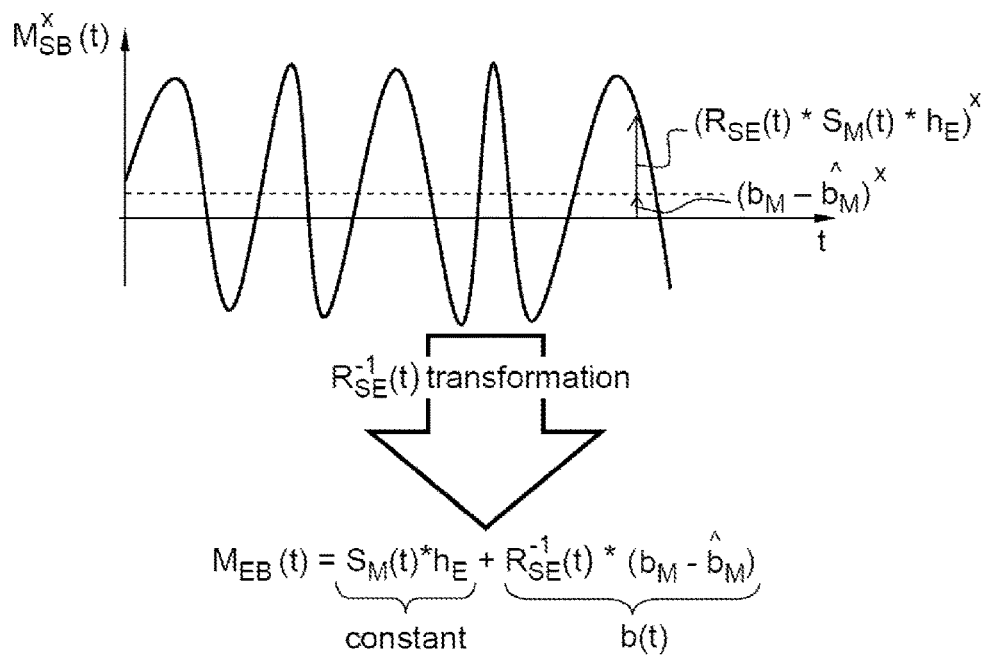
FIG. 3 schematically illustrates a method of the invention by which the measurement of the sensor is corrected of an estimated bias value, is made up, in the mobile frame, of a time-variable part due to the movements of the mobile in the reference frame in which the physical field is substantially continuous and of a constant part due to the bias residues; the corrected sensor measurement is transformed by a change of frame operator from the mobile frame to the reference frame; the duly transformed corrected measurement comprises a component that is substantially constant in time due to the substantially continuous physical field in the reference frame and a time-variable component representative of the bias residues of the physical sensor.
Figure 3:
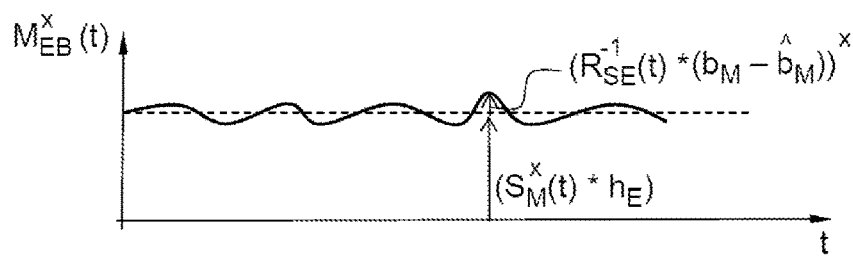

FIG. 3 illustrates this principle by showing that, for an estimated bias denoted $\hat{b}_M$, it is be possible to form, from $M_S(t)$, the vector $M_{SB}(t)$ by subtracting from it $\hat{b}_M$. The estimated bias denoted $\hat{b}_M$ can be obtained in any way. Either it is the best bias hitherto estimated, and obtained from a preceding bias estimation step as described by the embodiment of the invention, or it is an arbitrary value imposed upon initialization of the embodiment method. To provide this initialization value, a person skilled in the art will conventionally be able to refer to the technical data sheet of the sensor, for example, or take a value previously identified in the preceding calibration step. When the embodiment method operates continuously, the estimated bias value is taken to be equal to the preceding value estimated by the method, before the introduction of a new measurement. The transformation of $M_{SB}(t)$ by the rotation $R_S^{-1}(t)$ forms $M_{EB}(t)$ and reveals the continuous component due to the main field (since the latter is constant in the reference frame), and the variable component, product of the rotational transformation operator $R_{SE}^{-1}(t)$ applied to the vector $(b_M - \hat{b}_M)$. Thus, when $\hat{b}_M$ is a good estimator of $b_M$, this time-variable component tends toward 0 or toward a value solely dependent on the residual noise.

The criterion, function to be minimized on $\hat{b}_M$, is a function of $\hat{b}_M$ formed from the signal $M_{EB}(t)$ and representative of the variations of $M_{EB}(t)$. When this criterion is minimum for a value $\hat{b}_M$, then this value $\hat{b}_M$ is a good estimator of the value of the bias of the sensor $b_M$.

Figure 4:
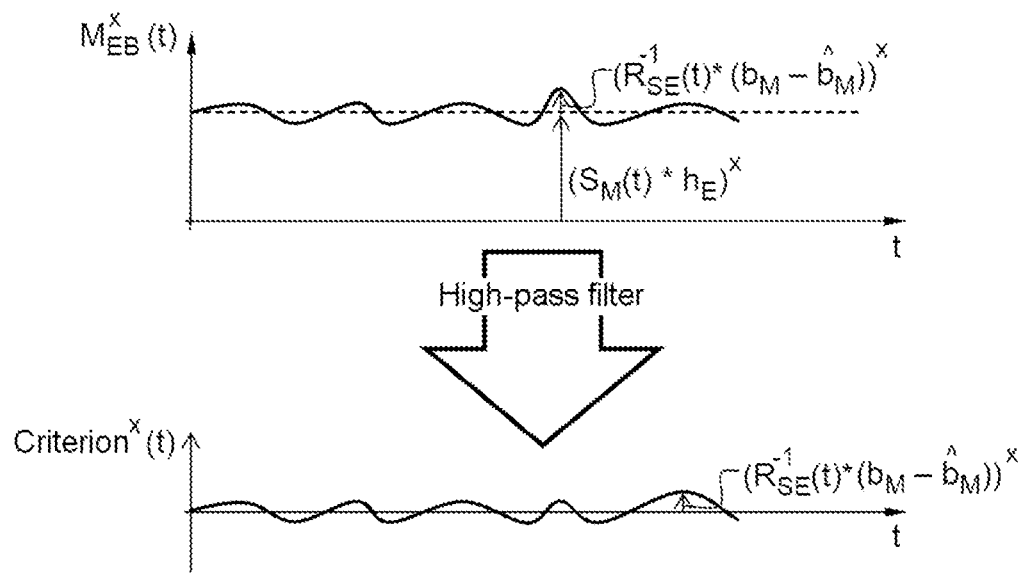
FIG. 4 schematically illustrates a high-pass filtering method applied to the measurement corrected then transformed in the reference frame and which isolates its time-variable part, representative of the bias residue of the physical sensor.

Very many criteria can be formed, from the moment they become representative of the variations of $M_{EB}(t)$. It is for example possible to form criteria from the statistics of a set of samples of $M_{EB}(t)$, for example taken over a time window of $M_{EB}(t)$. The average value is representative of the constant main field, and the statistics of difference between maximum and minimum or of standard deviation are representative of the variations of the signal and are therefore good candidates as criteria to be minimized over $b_M$. The time window can be sliding, which makes it possible to give a significant weight to the most recent samples and no longer take account of the oldest samples. In effect, the conditions in which the sensor is located can change in time and the bias estimator is then focused on the most recent situation. It is also possible to form a valid criterion, by an estimation of the temporal derivative of the signal $M_{EB}(t)$, because the derivative is representative of the variations of a signal. It will also be possible to form a valid criterion by high-pass filtering of the signal $M_{EB}(t)$, since this filtering cuts the continuous component and is thus representative of the variations of the signal $M_{EB}(t)$. Multiple possibilities and their variants are acceptable as criteria to be minimized over $\hat{b}_M$. Most of the criteria are equivalent to high-pass filters of $M_{EB}(t)$. FIG. 4 illustrates the result of a high-pass filtering on the signal $M_{EB}(t)$ to form an acceptable criterion. A person skilled in the art can choose other suitable criteria representative of the variations of $M_{EB}(t)$.

Figure 5:
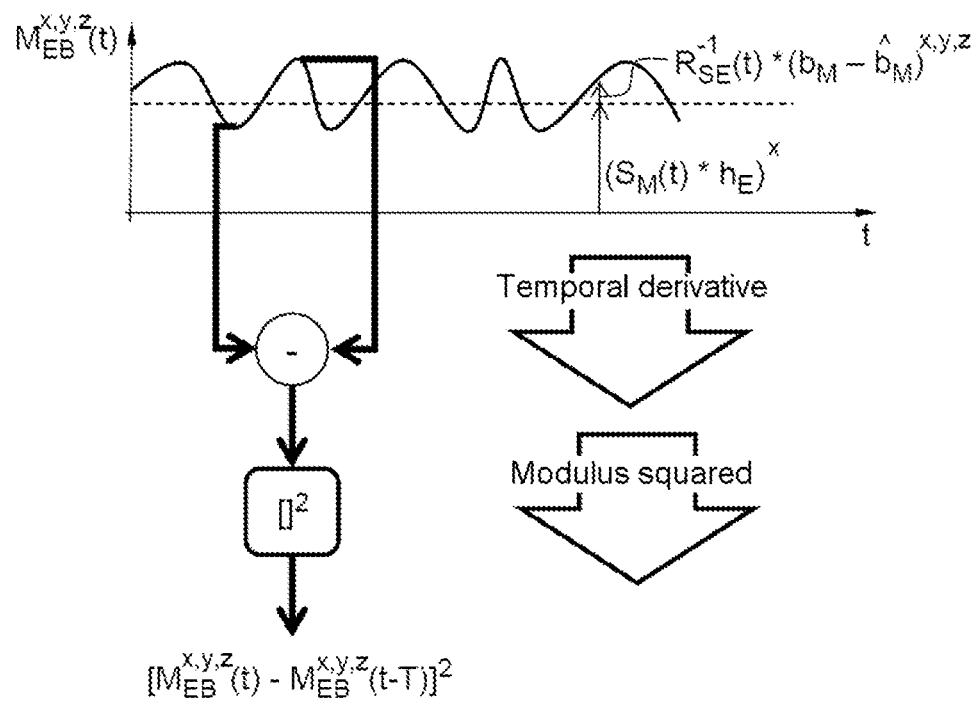
FIG. 5 schematically illustrates an exemplary high-pass filtering method, performed by differential computation, for example by difference between two measurements separated by a time interval, applied to the measurement corrected then transformed in the reference frame and which isolates its time-variable part, representative of the bias residues of the physical sensor.

FIG. 5 shows the formation of a criterion on the basis of a particular high-pass filter. Many methods are possible for forming a high-pass filter. For example, the criterion can be formed from a simple difference between two points of the signal $M_{EB}(t)$ separated by a delay T. The temporal derivative is representative of the variation of the signal $M_{EB}(t)$. On the vector with three components, in the case of a tri-axial sensor, the function to be minimized can be formed as follows: $f(t)=[M_{EB}(t)-M_{EB}(t-T)]^2$; $f(t)$ being a function which delivers a scalar value at each instant.

Once the criterion has been chosen, many methods can be employed to automatically estimate the bias $\hat{b}_M$. Iterative optimization methods can be employed to compute the criterion for successive values of $\hat{b}_M$ and that lead step-by-step to values of the criterion that are increasingly lower, and therefore a priori more optimal. Within this family of methods, it is possible for example to employ gradient descent methods. The bias $\hat{b}_M$ is then estimated step-by-step according to the following formula: $\hat{b}_M(k)=\hat{b}_M(k-1)-\mu\mathrm{grad}(f)$; $\mathrm{grad}(f)$ being the gradient relative to $\hat{b}_M$ of the criterion f. When f is defined as $f(t)=[M_{EB}(t)-M_{EB}(t-T)]^2$, then: $\mathrm{grad}(f)=-2(R_{SE}(t)-R_{SE}(t-T))(R_{SE}(t)\ M_S(t)-R_{SE}(t-T)\ M_S(t-T))$.

Figure 6:
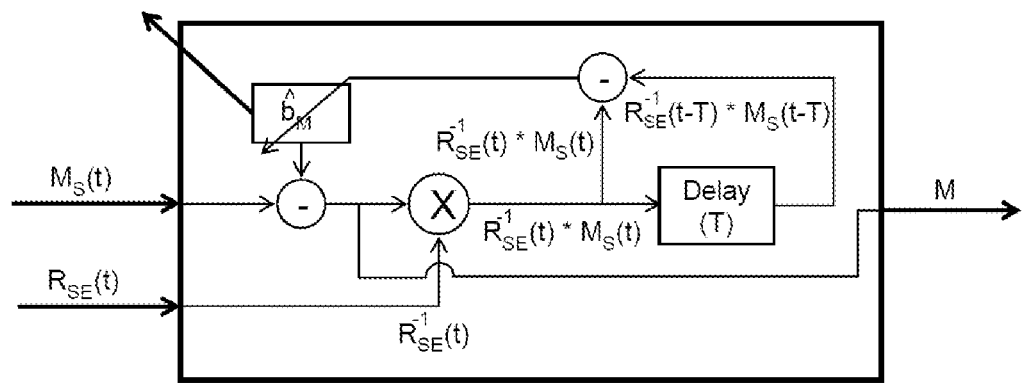
FIG. 6 schematically illustrates, in block diagram form, the computation stream according to one example of the invention, the measurement from the sensor is corrected of an estimated bias value, then transformed into the reference frame using a matrix computation performed from a rotation matrix between the mobile frame and the reference frame, a differential filter is applied to the transformed corrected measurement to form a criterion which is minimized on the estimated bias value.

FIG. 6 illustrates a device represented in block diagram form, implementing the principle of estimation of the bias $\hat{b}_M$ of the magnetometer M using the differential criterion f.

Other methods for computing the optimal $\hat{b}_M$ can be employed. For example, the systematic computation of the criterion for a table of possible values of $\hat{b}_M$ can be envisaged. Variants of the gradient descent methods can be constructed by iteratively computing $\hat{b}_M$ by testing a limited set of bias variations in a plurality of directions in the space of the biases and by retaining the one which minimizes the criterion as new bias value.

According to the method described above, the embodiment uses the availability of a representation of the rotation of the mobile object relative to the terrestrial reference frame E, previously denoted in the form of an operator $R_{SE}(t)$. To do this, it is possible to exploit the rotation estimated by an attitude control unit employing all or some of the combinations of accelerometric, gyrometric and magnetometric sensors. It is moreover possible to exploit a representation of the rotation of the mobile object relative to the reference frame, estimated from another sensor (optical, radio, electromagnetic, mechanical).

The rotation between mobile frame X and terrestrial frame E can take any convention of frame linked to Earth as frame E. For any frame fixedly linked to the Earth, even of unknown orientation relative to the Earth's axes conventionally used ("North, East, Down"), the proposed embodiment of the invention applies. In effect, the properties of the transformed signals described above of constancy of the main field and of variation of the component due to the bias remain entirely valid, even if the frame E chosen is not known relative to the conventional terrestrial frame ("North, East, Down"), to within a rotation. It is therefore not necessary, strictly speaking, to deliver, for $R_{SE}$, a rotation operator (for example, a rotation matrix) relative to an a priori known orientation frame relative to the terrestrial frame. This important property makes it possible to widen the scope of the possibilities for supplying the operator $R_{SE}(t)$. Thus, any sensor which supplies the rotation speed of the mobile object in the terrestrial frame is sufficient.

Figure 7:
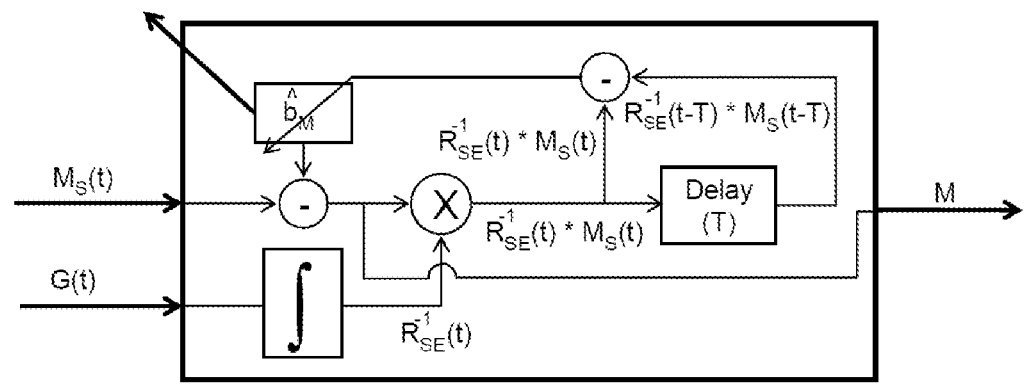
FIG. 7 schematically illustrates the method of FIG. 6, detailing that the computation of the transformation operator between the mobile frame and the fixed frame is performed by integration of the signal from a gyrometer embedded in the device.

Consequently, in an advantageous embodiment of the invention, it is possible to explore the datum from a gyrometric sensor in order to estimate a rotational transformation operator from the mobile frame to the reference frame (for example in the form of the matrix $R_{SE}(t)$). This type of sensor delivers the rotation speeds of the mobile object in the frame of the mobile object S. It is known to those skilled in the art that, from these data, it is possible to estimate the rotation $R_{SE}(t)$ of the mobile frame relative to an unknown frame linked fixedly to the terrestrial frame, with recourse to a time-integrational function of the data from the gyrometer. Just as it is possible to estimate a translation value from a linear speed datum to within a constant, it is possible and known to those skilled in the art to estimate a rotation from rotation speed data, to within a constant. Thus, various embodiments of the invention make it possible to make optimum use of the sensors conventionally present in attitude control units, like the gyrometer. The advantage is that the embodiment method exploits the information provided by this sensor. In the preceeding presentations of embodiments of the invention, it is therefore possible to replace the rotational transformation operator between the mobile frame and the reference frame $R_{SE}(t)$ by a function based on the gyrometer. FIG. 7 represents a variant of FIG. 6. In this variant, the rotation $R_{SE}(t)$ is computed from a calibrated gyrometer denoted G.

The gyrometers, in their low-cost version, exhibit bias drifts which can be not inconsiderable, especially inasmuch as the computations conventionally performed are of the integral method type, which tend to amplify the slow bias drifts. In effect, it is commonplace to observe drifts of several hundreds of degrees per hour. The method proposed here remains very robust to these problems of long-term drift inasmuch as the proposed criteria are generally computed over much shorter delays (from a few fractions of seconds to a minute) and there are therefore only drifts of a few fractions of degrees to a few degrees. Thus, the embodiments of the invention which form the criterion to be minimized over a limited window of samples from the past, or which give a decreasing weight to the samples as a function of their delay relative to the present instant, are advantageous.

Finally, in an advantageous embodiment of the invention, it is possible to add a bias-updating-decision logic step. In effect, for the real situations that are sometimes encountered, the disturbance field can take, for limited time intervals, significant values, even compared to the main field. The same applies to situations in which a magnetized object is displaced relative to the mobile device bearing the magnetic sensor or in the dual situations in which the mobile device approaches sources of disturbance to the main field (displacement over a table stand, for example, displacement of the mobile device in proximity to reinforcing bars, a car, etc). The hypothesis whereby the proposed embodiment of the invention is based on the constancy of the physical field in the reference frame is then somewhat compromised. The proposed transformation then includes a term of unknown behavior which is added to the main field and to the bias. The minimization of a criterion of variation of the transformed sensor signal $M_{EB}(t)$ can then lead to wrong estimations of the bias, which would be injected into the magnetometer calibration computation, thus degrading the performance of the sensor. In effect, any change of the constant physical field is considered as an outside disturbance. The outside disturbance is unknown and is not included in the hypothesis of the criterion. The outside disturbance is the variation of the constant physical field which can be due to the translation of the sensor in space, thus passing from a first field condition to a second field, and/or due to the temporary superposition of an additional physical field on the constant field.

The vector field measured and transformed (by the rotational change of frame operator) then also varies with the outside disturbance. To mitigate this problem, for which the method based on a criterion of variation can then be compromised, there are proposed a number of test logics prior to final validation (application to the system) of a candidate bias, which can be applied.

Thus, to mitigate this problem, it is proposed to set up a logic for updating the bias relative to the old bias, by comparing the value of the residue of the criterion obtained upon the last update of the bias, with the value of the residue of the current criterion. If the latter is much greater than the last criterion residue associated with the last bias, then it is probable that the magnetic situation does not conform to the hypotheses necessary to a good bias estimation and the bias should not be updated. As a variant, the threshold for acceptance of the new bias value can be made dependent on the time elapsed since the last accepted bias value, which allows for updates of the bias that are all the easier when a significant time has elapsed since the last update. The advantage is of not remaining blocked with a bias value estimated in conditions that are particularly advantageous in respect of the magnetic environment (for example rotations of the object, in a particularly uniform ambient field) while the bias of the sensor has changed since but the new residues of the criterion are not better than the old criterion residue value. This process makes the method robust and prevents bias updates being carried out which could degrade the preceding calibration of the sensor.

This first strategy of acceptance of a new bias value based on a test of actual improvement of the criterion can also be complemented or replaced. In effect, in the case of a disturbance, the continuous convergence of the estimated bias in the presence of this disturbance is not stable in time and the continuously estimated bias does not converge toward a stable value. It thus exhibits a time-variable nature, as a function of the outside disturbance. Thus, to correct the defect of the criterion which does not consider the unknown outside disturbance, it is possible to use an indicator of temporal stability of the estimated bias, in addition to the criterion based on the absolute value of current criterion residue presented above. This stability indicator can be computed for example by the temporal variation of the estimated bias. The variation can be implemented for example in the form of energy of the estimated bias, or by high-pass filtering of the estimated bias, or, for example, by the computation of its variance, or by any other computational method which extracts the intensity of the temporal variation from the continuously estimated bias.

Embodiments of the invention have been described in particular for the case of a magnetic field sensor, the bias of which is particularly subject to continuous or abrupt variations during the use of the product in which it is embedded. It is therefore particularly relevant for this type of device.

Other embodiments of the invention do, however, remain applicable to all the sensors which measure a physical field that is substantially constant in time and in space in a reference frame and for which a continuous estimation of the bias must be produced. Thus, just as the magnetometer measures the Earth's magnetic field, the accelerometer measures the gravitational field linked to the Earth. As for the magnetometer, the reference frame applicable will be the terrestrial frame. The same type of method can therefore be used in order to continuously estimate the bias of an accelerometer on board a mobile device. The particular feature of the accelerometer is however that it measures, in addition to the ambient gravitational field, the acceleration components due to the very movement of the mobile device ("own" acceleration). This adds a component which is considered as "disturbing" for the method, just as the disturbance field is for the magnetic field, and introduces a component previously denoted $p_S(t)$. The duly constructed bias estimator will be able to be disturbed upon fairly strongly accelerated movements, for which the value of the acceleration due to the movement can no longer be considered small compared to the component of the gravitational field. However, the bias validation method makes it possible to fight against incorrect updates of the bias and the method thus remains robust in relation to these situations.

The steps of the method described above can be performed by one or more programmable processors executing a computer program to perform the functions of an embodiment of the invention by acting on input data and by generating output data.

A computer program can be written in any programming language, such as the compiled or interpreted languages, and the computer program can be deployed in any form, including as standalone program or as a subroutine or function, or any other appropriate form for a use in a computer environment.

A computer program can be deployed to be executed on one computer or on several computers on one and the same site or on several distributed sites interlinked by a communication network.

The invention claimed is:

1. An iterative method, for use in a mobile device comprising a sensor, for calibrating a bias of the sensor for measuring a substantially continuous physical vector field in a reference frame, said sensor being linked in movement to the mobile device having a mobile frame relative to the reference frame, an iteration of the method comprising the following steps: determining an estimated bias value of the sensor in the mobile frame;
   receiving, from the sensor, a first sensor measurement signal comprising a first measurement associated with a physical orientation of the mobile device in the mobile frame;
   generating a corrected first sensor measurement signal, based on the estimated bias value and the first sensor measurement signal;
   receiving, from a gyrometer, a second signal comprising a second sensor measurement signal associated with a rotational change of a frame operator between the mobile frame and the reference frame;
   transforming said corrected first sensor measurement signal based on the rotational change of the frame operator between the mobile frame and the reference frame;
   determining, based on the transformed corrected first sensor measurement signal, a criterion having an amplitude representative of a bias residue of the sensor in the corrected first sensor measurement signal, and
   calibrating the bias of the sensor based on the determined criterion.

2. The method as claimed in claim 1, further comprising, in each iteration, a step comprising:
   minimizing said bias residue as a function of said estimated bias value by comparing a value of the bias to the estimated bias value minimizing the criterion.

3. The method as claimed in claim 1, wherein said criterion is formed by application, to said transformed corrected first measurement, of a high-pass filtering operator, in order to extract an indicator of the variation relative to a continuous component.

4. The method as claimed in claim 3, wherein the high-pass filtering operator is a derivative filter.

5. The method as claimed in claim 3, wherein said criterion comprises a norm of a deviation between at least two values computed at least two distinct instants, each of the values being computed by the application of the change of the frame operator between the mobile frame and the reference frame to the corrected first sensor measurement signal.

6. The method as claimed in claim 1, wherein the determination of the estimated bias value is based on a gradient descent method.

7. The method as claimed in claim 1, wherein said calibration of the bias of the sensor is continuous.

8. The method as claimed in claim 1, further comprising:
   in each iteration, validating an update of a candidate bias value, said validation being determined from an analysis of at least two values of said criterion corresponding to a value of a validated preceding bias value and to said update candidate bias value.

9. The method as claimed in claim 8, wherein said analysis comprises a verification that the value of the criterion corresponding to the candidate bias value is less than or equal to a function applied to the value of the criterion associated with the validated preceding bias value.

10. The method as claimed in claim 9, wherein said function is identity.

11. The method as claimed in claim 9, wherein said function further depends on a time elapsed since the validated preceding bias value.

12. The method as claimed in claim 1, further comprising: validating an update of a candidate bias value, said validation being determined from a stability analysis of the candidate bias value.

13. The method as claimed in claim 12, wherein the stability analysis is determined from a temporal variation of the candidate bias.

14. The method as claimed in claim 1, wherein said rotational change of the frame operator between the mobile frame and the reference frame comprises a rotation matrix between the mobile frame and the reference frame.

15. The method as claimed in claim 1, wherein said sensor includes a magnetometer or an accelerometer.

16. A mobile device comprising a sensor and a processor, the mobile device configured for iteratively calibrating a bias of the sensor for measuring a substantially continuous physical vector field in a reference frame, said sensor being linked in movement to the mobile device having a mobile frame relative to the reference frame, the processor configured to:
  determine an estimated bias value of the sensor in the mobile frame; receive, from the sensor, a first sensor measurement signal comprising a first measurement associated with a physical orientation of the mobile device in the mobile frame;
  generate a corrected first sensor measurement signal, based on the estimated bias value and the first sensor measurement signal;
  receive, from a gyrometer, a second signal comprising a second sensor measurement signal associated with a rotational change of a frame operator between the mobile frame and the reference frame;
  transform said corrected first sensor measurement signal based on the rotational change of the frame operator between the mobile frame and the reference frame;
  determine, based on the transformed corrected first sensor measurement signal, a criterion having an amplitude representative of a bias residue of the sensor in the corrected first sensor measurement signal, and
  calibrate the bias of the sensor based on the determined criterion.

* * * * *